(12) United States Patent
Von Der Brueggen et al.

(10) Patent No.: US 9,420,686 B2
(45) Date of Patent: Aug. 16, 2016

(54) COATING SYSTEM WITH ELECTROSTATIC DISCHARGE PROTECTION

(71) Applicant: SIKA TECHNOLOGY AG, Baar (CH)

(72) Inventors: Uwe Von Der Brueggen, Meckesheim (DE); Lars Conrad, Stuttgart (DE); Henry Heinrich, Malsch (DE); Jochen Groetzinger, Schwaebisch Gmuend (DE)

(73) Assignee: SIKA TECHNOLOGY AG, Baar (CH)

( * ) Notice: Subject to any disclaimer, the term of this patent is extended or adjusted under 35 U.S.C. 154(b) by 0 days.

(21) Appl. No.: 14/758,820

(22) PCT Filed: Dec. 20, 2013

(86) PCT No.: PCT/EP2013/077829
§ 371 (c)(1),
(2) Date: Jul. 1, 2015

(87) PCT Pub. No.: WO2014/108310
PCT Pub. Date: Jul. 17, 2014

(65) Prior Publication Data
US 2015/0342029 A1    Nov. 26, 2015

(30) Foreign Application Priority Data

Jan. 9, 2013 (EP) ..................................... 13150686

(51) Int. Cl.
*H05K 1/03* (2006.01)
*H05K 3/00* (2006.01)
*H05K 1/02* (2006.01)
(Continued)

(52) U.S. Cl.
CPC .............. *H05K 1/0313* (2013.01); *H05F 3/025* (2013.01); *H05K 1/0215* (2013.01);
(Continued)

(58) Field of Classification Search
CPC ... H05K 1/0313; H05K 1/032; H05K 1/0326; H05K 1/0333; H05K 1/034; H05K 1/0346; H05K 3/0058; H05K 3/0061; H05K 3/0064; H05K 3/0067
See application file for complete search history.

(56) References Cited

U.S. PATENT DOCUMENTS

2004/0156997 A1   8/2004   Burkhart et al.

FOREIGN PATENT DOCUMENTS

DE   299 20 803 U   1/2000
EP   0 269 934 A1   6/1988

OTHER PUBLICATIONS

International Search Report (PCT/ISA/210) mailed on Jan. 31, 2014, by the European Patent Office as the International Searching Authority for International Application No. PCT/EP2013/077829.
(Continued)

*Primary Examiner* — Jeremy C Norris
(74) *Attorney, Agent, or Firm* — Buchanan Ingersoll & Rooney PC

(57) ABSTRACT

A coating system on a substrate for the protection against electrostatic discharge, includes in the following order a) an undercoat on the substrate, b) a non-dissipative synthetic resin layer and c) a dissipative synthetic resin layer having a resistance to ground according to VDE-0100-410 of at least 100 kohm, wherein a grounding device for grounding the coating system is arranged between the dissipative synthetic resin layer and the non-dissipative synthetic resin layer. The coating system can be a floor coating system. In this way, systems having low TVOC emission can be formed. This system structure is also suitable for the simple conversion of existing, purely insulating coating structures into systems with ESD capability, and the system structure can be very easily renewed if renovation is required because of wear.

20 Claims, 1 Drawing Sheet

(51) Int. Cl.
   *H05K 3/28*  (2006.01)
   *H05K 3/30*  (2006.01)
   *H05K 3/46*  (2006.01)
   *H05F 3/02*  (2006.01)

(52) U.S. Cl.
   CPC ............ *H05K 3/0058* (2013.01); *H05K 3/284* (2013.01); *H05K 3/30* (2013.01); *H05K 3/4673* (2013.01); *H05K 2203/0759* (2013.01); *Y10T 29/49147* (2015.01)

(56) References Cited

OTHER PUBLICATIONS

Notification of Transmittal of Translation of the International Preliminary Report on Patentability (Forms PCT/IB/373 and PCT/ISA/237) issued on Jul. 23, 2015, by the International Bureau of WIPO in corresponding International Patent Application No. PCT/EP2013/077829. (6 pages).

COATING SYSTEM WITH ELECTROSTATIC DISCHARGE PROTECTION

TECHNICAL FIELD

The invention relates to a coating system, especially a floor coating system, on a substrate for protection against electrostatic discharge and to a method for the production thereof.

PRIOR ART

In many fields of industry today, demands are high in regard to optimal conditions of the surroundings. In particular, avoiding uncontrolled electrostatic charge and discharge is of the utmost importance.

Electrostatic charge and discharge takes place as a result of contact, friction or separation of two materials. When this occurs, one of the materials takes on a positive charge, and the other, a negative charge. In the case of floor coatings, this charge is generated by walking or driving on them, for example with rubber shoe soles or rubber tires. Air flow can also produce charges on insulating surfaces, such as paints or coatings.

Therefore, floors and walls having low resistances to ground, which dissipate an electrostatic charge immediately and in a controlled manner, are required in sensitive rooms. Numerous standards exist for such electrostatically dissipative coatings, which include test methods for evaluating coatings for their suitability in terms of their electrostatic or electrical behavior.

For example, DIN EN 61340-4-1 describes test methods for determining the electrical resistance of floor coverings and installed floors. In DIN EN 61340-4-5, electrostatic safety is assessed with regard to electrical resistance and the possibility of charge buildup of footwear and floor coverings in combination with a person. DIN VDE 0100-410 contains requirements for the reliable protection of people against electric shock from the viewpoint of the risk of coming into contact with current-carrying components.

To meet the requirements, electrically conductive floors having a defined resistance are generally necessary. Floors based on cement or magnesium oxide generally do not have defined electrical conductivity. Floors made from synthetic resins are usually not conductive. However, by modifying the synthetic resins, for example, by adding conductive pigments, ionic liquids or conductive fibers or combinations of the above-mentioned examples, it is possible to create synthetic resin coatings that have exactly defined dissipation values or insulating properties. Therefore, synthetic resin coatings that have been made dissipative have become widely established as defined dissipative floor coatings.

Coating systems having ESD protection (ESD="electrostatic discharge"), i.e., providing protection against electrostatic discharge, are known. The conventional system structure according to the prior art is shown in FIG. 2 and consists of the following individual layers:
1. Dissipative thin layer coating 4 having a resistance to ground according to VDE 0100-410 of at least 100 kohm
2. Dissipative thick layer coating 6 ($10^4$-$10^7$ ohm)
3. Conductive film 5 and conductor set, for example, made from copper strips, for grounding the system
4. Undercoat 2 and optional scratch coat
5. Substrate 1, for example, concrete This concept according to the prior art has a number of drawbacks. The coating structure is relatively complex and requires a conductive film, for example. If the dissipative thin coating is damaged or inevitably worn away during use, protection of persons according to VDE 0100-410 is no longer guaranteed. When renovation becomes necessary, complete renovation is required, i.e., the entire layer structure must be replaced. When existing floor coatings are to be converted into coatings having ESD protection, it is necessary to restore the entire above-described complex coating structure. This is time-consuming and entails considerable costs.

SUMMARY OF THE INVENTION

The object of the invention was to provide a coating system having ESD protection that does not have the above-mentioned drawbacks. Especially a combination of the following properties was to be achieved: ESD protection, protection of persons according to VDE 0100-410, very low emission values for volatile organic compounds (VOC="volatile organic compounds", TVOC="total volatile organic compounds"), increased system robustness, rapid installation time and high flexibility when upgrading existing coatings to ESD coatings. The term TVOC here shall be understood to collectively encompass the very volatile organic compounds (VVOC), VOCs and semi-volatile organic compounds (SVOC). The aforementioned definitions correspond to those of the AgBB scheme, which in turn are based on the definitions in DIN ISO 16000-6. Particularly relevant with regard to the use of coatings in interior rooms and breaks rooms are assessment methods such as AgBB (Germany), M1 (Finland), DICL (Denmark), AFSSET (France) and various assessment systems for characterizing the sustainability of buildings. As a representative method, the method of the DGNB [German Sustainable Building Council] in Germany shall be named.

Surprisingly it was possible to obtain this combination of properties with a coating structure according to FIG. 1. Correspondingly, the invention relates to a coating system on a substrate 1 for protection against electrostatic discharge, comprising in this order a) an undercoat 2 and optional leveling on the substrate 1, b) a non-dissipative synthetic resin layer 3 and c) a dissipative synthetic resin layer 4 having a resistance to ground according to VDE-0100-410 of at least 100 kohm, wherein a grounding device for grounding the coating system is arranged between the dissipative synthetic resin layer 4 and the non-dissipative synthetic resin layer 3.

The coating system according to the invention can be a floor coating system or a wall coating system, wherein it is preferably a floor coating system. The coating system has broad commercial utility and exhibits numerous advantages compared to the systems according to the prior art.

For example, the floor coating system according to the invention meets the requirements for the protection of persons according to VDE 0100-410. If during use of the flooring system unavoidable material abrasion or damage occurs to the dissipative coating, which as a rule is designed as a thin layer, the resistance of the system in principle increases and thus ensures reliable and long-lasting protection of persons, as required. The extent to which the ESD protection deteriorates or may no longer be present can be checked by simple resistance measurements of the system, such as are regularly required in ESD areas and are routinely performed.

In addition, this system structure is suitable for the simple, cost-advantageous and rapid conversion of existing purely insulating coating structures into ESD-capable systems. In the case of a renovation or planned conversion, from a technical viewpoint it is only necessary to rework or replace the top, preferably thin, dissipative layer and introduce a corresponding conductor set, which on one hand provides considerable cost advantages over a complete renovation, such as would be needed in the case of a conventional coating structure, and on the other hand also offers considerable advantages in terms of sustainability.

Through a combination of a conductive coating having low (T)VOC emission on an insulating coating that also has low (T)VOC emission, it is possible very simply to obtain a coating system that, in addition to the aforementioned advantages, also meets strict requirements for VOC emission behavior, such as the AgBB scheme, which applies to break rooms in Germany. Very stringent VOC requirements from the high tech industry, for example, from the fields of semiconductors, optics, lithography, pharmaceuticals, life sciences, and automobiles, can be very easily combined with ESD properties using the coating system according to the invention.

Compared to a system structure according to the prior art as shown in FIG. 2, it is possible according to the invention to dispense with a conductive film. This reduces the complexity of the coating structure, thus increasing the robustness by reducing the number of potential sources of malfunction and allowing more rapid installation of the system on the customer's premises.

WAY TO IMPLEMENT THE INVENTION

Figure 1:
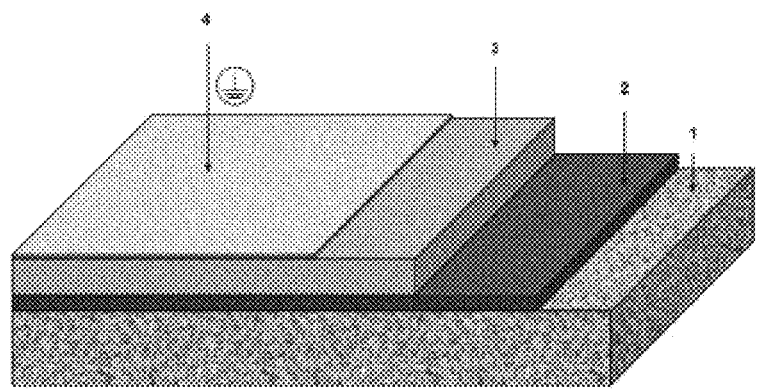
FIG. 1: Schematic diagram of an ESD coating system according to the invention.
Figure 2:
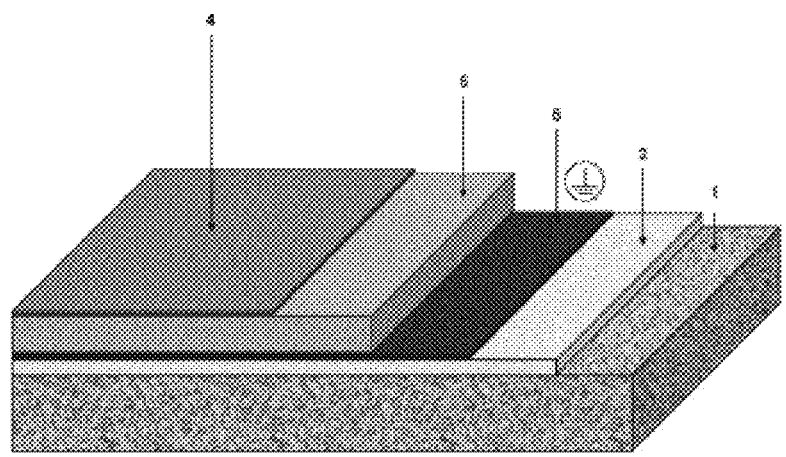
FIG. 2: Schematic diagram of an ESD coating system according to the prior art

The coating system according to the invention is suitable for all floors, industrial floors and walls for which ESD protection is required, especially for floors. Sectors in which such floors or walls are required are, for example, the electrical and electronics industry, microelectronics, high-precision optics, biotechnology, lithography, pharmaceuticals, life sciences, the automotive industry or in the manufacturing of data carriers. The coating systems according to the invention are suitable, for example, for clean rooms, production facilities, assembly facilities, laboratories and the like, in which electrostatic charges should or must be avoided.

The individual layers of the coating system according to the invention are known in and of themselves. The person skilled in the art can readily produce them, using known materials in the usual way according to known methods in advantageous embodiments, for example, in terms of color or layer thickness.

In the coating system according to the invention, the layer thickness of the non-dissipative synthetic resin layer 3 can vary within broad ranges and can be selected in accordance with the intended use. As a rule it is expedient for the non-dissipative synthetic resin layer 3 to be a thick layer. For example, the non-dissipative synthetic resin layer 3 suitably has a layer thickness in the range of 0.5 to 20 mm, preferably of 0.5 to 10 mm and more preferably of 1 to 5 mm.

The layer thickness of the dissipative synthetic resin layer 4 can likewise vary within broad ranges and be selected in accordance with the intended use. As a rule it is expedient for the dissipative synthetic resin layer 4 to be a thin layer. The dissipative synthetic resin layer 4 has, for example, a layer thickness of less than 5 mm, suitably in the range of 20 to 5000 μm, preferably of 20 to 1000 μm and more preferably of 20 to 200 μm.

Dissipative layers may also be called electrostatically dissipative layers. As opposed to non-dissipative or insulating layers, they permit an electrostatic charge that is building up to dissipate. For this purpose, dissipative layers have a certain electrical conductivity. Dissipative and non-dissipative layers are known to the person skilled in the art, and such a person can readily produce them.

The dissipation capacity can be determined, for example, by way of the resistance to ground of the layer. As used here and insofar as not stated otherwise, the resistance to ground of a layer can be determined according to the standard IEC 61340-4-1. Here and according to the IEC 61340-4-1 and IEC 61340-5-1 standards, a layer is considered conductive or electrostatically conductive if it has a resistance to ground of no more than $10^9$ ohm. Layers having higher resistances to ground are non-dissipative.

In the case of layers located in installed form over the conductor set, the resistance to ground is determined as described in IEC 61340-4-1. The resistance to ground of a subjacent layer is not relevant for the ESD properties of the coating system. Therefore, measurement of the resistance to ground there is not necessary.

In the coating system according to the invention, the dissipative synthetic resin layer 4 has a resistance to ground according to VDE 0100-410 (VDE-0100-410 Appendix C 1.5 (Requirements Standard); VDE-0100-600 Appendix A (measurement standard)) of at least 100 kohm.

The resistance to ground and the system resistance according to the standard series IEC 61340 can vary within broad ranges as long as dissipative capacity is present. For example, the dissipative synthetic resin layer 4 suitably has a resistance to ground or a system resistance of no more than $10^9$ ohm, and preferably no more than $2.5 \times 10^8$ ohm; the resistance to ground can, for example, preferably be in the range of $10^6$ ohm to $2.5 \times 10^8$ ohm. The voltage with which a body may become charged under defined conditions as described in IEC 61340-4-5 (so-called "body voltage") is preferably limited to less than 100 volts according to IEC 61340-5-1.

The non-dissipative synthetic resin layer 3 is an insulating layer. The resistance to ground of the non-dissipative synthetic resin layer 3 can vary within broad ranges, as long as no dissipative capacity is present. The non-dissipative synthetic resin layer 3 can, for example, have a resistance to ground of more than $10^9$ ohm, more suitably at least $10^{10}$ ohm and preferably at least $10^{11}$ ohm. The resistance to ground of the non-dissipative synthetic resin layer 3 can be determined according to the standard IEC 61340-4-1 before the grounding device is installed and the dissipative synthetic resin layer 4 is applied. However, measurement is generally unnecessary, since the synthetic resin layers that may be used are insulators per se and meet this condition as long as no conductive additives are mixed in.

The non-dissipative synthetic resin layer 3, the dissipative synthetic resin layer 4 and, insofar as the preferred synthetic resin undercoat is used as the undercoat, the undercoat as well are based on a synthetic resin. The optional scratch coat can be based on a synthetic resin. Synthetic resin layers as floor coverings or wall coverings are well known to the person skilled in the art and are widely used in this field. If not stated otherwise, the following statements apply equally to the synthetic resin layers 3 and 4, the synthetic resin undercoat and the optional scratch coat.

Synthetic resin layers are made of cured reaction resins or reactions resin compounds, wherein reaction resin compounds are usually understood to mean reaction resins containing one or more additives, for example, fillers and/or solvents. To produce the synthetic resin layers, reaction resins, usually with the aid of a curing agent, which may also contain accelerators, are reacted. The reaction leads to an increase in viscosity and finally to curing of the reaction resin. A synthetic resin that is usually thermosetting is obtained.

Such reaction resin systems are commercially available in great variety. They are frequently two-component systems, in which one component is the reaction resin and the other comprises the curing agent or accelerator. In addition, 3- or more-component systems are used, for example, if in addition a cement binder or conventional or special filler mixtures are used. In the case of systems having two, three or more components, the components are mixed with each other and then processed. After mixing, the reaction resins cure by chemical reaction after a certain amount of time and thus form the layer. The reaction resins can be formulated, for example, to be self-leveling or spatula-spreadable for use.

All conventional reaction resins known to the expert can be used to produce the non-dissipative synthetic resin layer 3, the dissipative synthetic resin layer 4, and optionally the synthetic resin undercoat 2 and the optional scratch coat. The same or different reaction resins can be used for the individual layers. The reaction resins, especially those mentioned hereinafter, can be used in solvent-containing, solvent-free or water-based form.

The reaction resins used for the respective layer or optionally the undercoat or the scratch coat are preferably selected independently of one another from epoxy resins, polyurethanes, polyureas, mixtures of polyurethanes and polyureas, poly(meth)acrylates, cementitious hybrid systems and polymer-modified cementitious mixtures (PCC "polymer cement concrete"). Particularly preferred reaction resins for the individual layers are listed hereafter in the description of the individual layers.

Reaction resins for producing the synthetic resins shall also be understood here to mean reaction resins that contain cement fractions, such as the above-mentioned cementitious hybrid systems and polymer-modified cementitious mixtures. Such cement-containing reaction resins are also commercially available. Cementitious hybrid systems are sold, for example, by Sika AG, for example, Sikafloor® EpoCem products, a three-component system comprising epoxy resin and cement, or Sikafloor® PurCem products, likewise a three-component system comprising polyurethane resin and a cementitious component. In addition, two- and three-component synthetic resins shall be understood to be included in this group, for example the Sikafloor® HyCem products, in which one component can consist of synthetic resin dispersions or synthetic resin emulsions.

The synthetic resin layers 3 and 4, the undercoat, and the optional scratch coat can, as needed, independently of one another, contain one or more additives. By adding additives to the reaction resins, the properties of the synthetic resin layers thus formed can be modified. For example, the electrical or mechanical properties, the viscosity or the color of the synthetic resin layers can be set with additives. Naturally, different additives may be used for the synthetic resin layers 3 and 4, the undercoat and the optional scratch coat, depending on the desired modification.

The additives can already be present in the reaction resin or be mixed to the reaction resin before processing.

Examples of possible additives, in addition to solvents and water, are coloring agents, such as colored quartz, dyes, pigments and color chips; fillers, such as quartz sand, ceramic powder, sand, chalk, fibers, hollow spheres and glass beads; emulsifiers, thixotropic agents, and film-forming aids.

Suitable additives for setting the electrical properties, which can be used in particular to set the conductivity of the conductive layer 4, are conductive additives, for example conductive fillers, such as conductive pigments or conductive fibers, salts, ionic liquids, ionic and nonionic surfactants, and combinations thereof. Specific conductive additives for setting the electrical properties are, for example, carbon fibers, carbon black, graphite, silicon carbide, metal oxides, metals, such as iron, ammonium salts, metal-containing or heavy metal-containing fillers, especially antimony- and tin-containing fillers based on titanium dioxide or mica, ionic liquids, ionic and nonionic surfactants, melamine sulfonates and polycarboxylate ethers, and combinations thereof. The conductive additives for setting the electrical properties can, for example, be added in the form of powders, fibers, turnings, in liquid form, flakes or granules. Conductive salts can also optionally be added as solutions.

In principle, all substrates present in edifices are suitable for use as the substrate 1 for the coating, especially the floor or flooring coating. Examples of suitable substrates are concrete, cement screed, magnesium oxide screed, ceramic tiles, asphalt, and optionally any synthetic resin coatings already present.

To produce the coating system according to the invention, first the undercoat 2 is applied to the underlay, optionally after conventional substrate pretreatment, for example, grinding, sand-blasting, shot blasting or stripping with solvents or acids. For the undercoat, a conventional undercoat composition is applied, for example, a reaction resin or a reaction resin compound, or alternatively a water-based synthetic resin dispersion, and cured. This is preferably a synthetic resin undercoat based on cured reaction resins.

Preferred reaction resins for the synthetic resin undercoat were already mentioned above. The synthetic resin undercoat can preferably be formed of a cured epoxy resin or a cementitious hybrid system. Possible additives that can be present in the undercoat, especially the synthetic resin undercoat, may include, for example, fillers, color pigments, dyes, thixotropic agents, deaerating aids, and adhesive promoters such as silanes. Suitable commercial products that can be used to produce the undercoat, for example, can be Sikafloor®-156, -160, -161, -144 and -1410 from Sika AG, which are two-component epoxy resins.

Optionally, a scratch coat can be applied to the undercoat 2 and cured. This can be advantageous for leveling, for example if the substrate is uneven. All conventional scratch coats may be used as the scratch coat. Suitable for example are all reaction resins, especially those mentioned for the synthetic resin undercoat, which may be additionally filled with a filler, for example, quartz sand, powdered quartz or chalk. For example, Sikafloor®-156, -160, -161, -144 and -1410 filled with quartz sand are well-suited, for example.

Then the reaction resin composition for the non-dissipative synthetic resin layer 3 is applied to the undercoat or, if a scratch coat was applied, to the scratch coat, and cured. As was mentioned above, synthetic resins are usually nonconductive and are non-dissipative. Such non-dissipative synthetic resin layers can be produced so that they exhibit very low emission of volatile organic compounds, which is highly advantageous, as described above.

Preferred reaction resins for the non-dissipative synthetic resin layer 3 were already named above. The non-dissipative synthetic resin layer can preferably be formed of cured epoxy resin, polyurethane, mixtures of epoxy resin and polyurethane, polyurea, mixtures of polyurethanes and polyureas, polyesters, poly(meth)acrylates, a cementitious hybrid system or a dispersion coating. In a preferred embodiment, solvent-free reaction resins may be used to produce the non-dissipative synthetic resin layer 3. Possible additives that the non-dissipative synthetic resin layer may contain include, for example, fillers, colored pigments, dyes, thixotropic agents, deaerating aids, and adhesive promoters such as silanes. Suitable commercial products that may be used to produce the non-dissipative synthetic resin layer, for example, are Sikafloor®-264, Sikafloor®-266CR and Sikafloor®-269CR from Sika AG, which are two-component epoxy resins. Sikafloor®-266CR and Sikafloor®-269CR are solvent-free systems, so that they have extremely low TVOC emissions. Additionally, two-component polyurethane coatings from Sika AG may be mentioned, such as Sikafloor®-300N and Sikafloor®-326, which likewise have extremely low TVOC emissions.

A particular advantage of the system according to the invention comes into play if an existing coating is to be upgraded to an ESD coating system. Since conventional coatings often have a non-dissipative coating as the top layer, this can serve as the non-dissipative synthetic resin layer 3. Therefore it is only necessary for the upgrade to install the grounding device and cover it with the dissipative synthetic resin layer 4. Complete renovation, as would be required with the ESD systems according to the prior art, is not necessary.

The grounding device for grounding the coating system is installed on the cured non-dissipative synthetic resin layer 3. For electrically connecting the electrostatically dissipative coating, the grounding device is connected to the equipotential bonding. Such grounding devices are known to the person skilled in the art, and such a person can readily implement them. The grounding device can, for example, be formed by a grounding conductor or an arrangement of grounding conductors, which are connected to the equipotential bonding. The bonding to the equipotential bonding or ground potential can take place via one or more grounding connections.

Suitable grounding conductors include, for example, copper tapes and/or so-called conductor sets, which are installed to dissipate the potential. Self-adhesive copper strips may be used, which can be applied in a simple manner to the non-dissipative layer 3. Conductor sets are commercially available; for example, the Sikafloor® conductor set. The conductor set is made up of pegs with copper tapes, washers and a threaded rod. In this way a so-called grounding point is established, which can subsequently be connected to ground by a skilled electrician.

As was explained above, it is necessary in ESD coating systems according to the prior art for a conductive film to be provided in the coating system. This is an electrostatically highly dissipative thin layer. Such a conductive film is not necessary in the coating system according to the invention, so that this can be dispensed with. Thus it is preferable according to the invention that no conductive film is provided in the coating system, especially not on the undercoat.

The reaction resin composition for the dissipative synthetic resin layer 4 is applied to the grounding device and the non-dissipative synthetic resin layer 3 and cured. The dissipative synthetic resin layer 4 is the top layer and functions as the electrostatically dissipative surface of the coating system. Preferred reaction resins for the dissipative synthetic resin layer 4 were already mentioned above. The non-dissipative synthetic resin layer can preferably be made from cured epoxy resin, polyurethanes, polyurea or polyurethane-polyurea mixture.

As was mentioned above, synthetic resins are usually non-conductive and are not electrostatically conductive. The measures for producing a conductive synthetic resin layer are known to the person skilled in the art. The adjustment can, for example, be easily made by adding conductive additives to the reaction resin for the conductive layer. The conductive synthetic resin layer 4 therefore preferably contains one or more conductive additives. Examples of suitable conductive additives were described above. By selecting the type and quantity of added conductive additive in the reaction resin, the person skilled in the art can set the degree of conductivity of the resin layer in a defined manner, expressed, for example, in the resistance to ground.

Possible further additives that the dissipative synthetic resin layer 4 can contain include, for example, fillers, color pigments, dyes, thixotropic agents, deaerating aids, and adhesive promoters, for example, silanes.

Reaction resin products for producing dissipative synthetic resin layers that are suitable for ESD coating systems are commercially available. For example, Sikafloor® 230ESD Topcoat and Sikafloor® 305W ESD from Sika AG may be mentioned. Sikafloor® 230ESD Topcoat is a conductive two-component epoxy resin system. Sikafloor® 305W ESD is a conductive two-component polyurethane system.

General processing methods and processing equipment that can be used to produce the individual layers are known to the person skilled in the art. Special advice for processing certain commercially available reaction resin products can usually also be found in the related product data sheets.

The individual layers can also be designed as double layers or multiple layers, but this is generally not preferred. It is also possible for additional intermediate layers to be optionally arranged in the coating system. Examples of such intermediate layers are those that also have crack-bridging properties (for example, Sikafloor® 350 or Sikafloor® 390). However, intermediate layers are not preferred. In a preferred embodiment, the coating system according to the invention is composed of the undercoat 2, the non-dissipative synthetic resin layer 3, the grounding device and the dissipative synthetic resin layer 4 as described and as defined in the claims, wherein optionally a scratch coat is arranged between the undercoat 2 and the non-dissipative synthetic resin layer 3.

LIST OF REFERENCE NUMERALS

1 Substrate
2 Undercoat
3 Non-dissipative (insulating) synthetic resin layer
4 Dissipative synthetic resin layer
5 Conductive film
6 Dissipative synthetic resin layer

EXAMPLES

The following ESD VOC-VDE0100 coating system corresponding to FIG. 1 was produced:
 Undercoat: Sikafloor® 161; layer thickness 500 μm
 Non-dissipative synthetic resin coating: Sikafloor® 264; layer thickness 1500 μm Dissipative synthetic resin coating: Sikafloor® 230 ESD TopCoat; layer thickness 80 μm Before applying the dissipative synthetic resin coating, a Sikafloor® conductor set was installed on the applied non-dissipative synthetic resin coating in accordance with the installation instructions:
1) Drill a hole D=8 mm/50 mm deep, clean drilling site until dust-free.
2) Flush-mount plastic peg, screw hanger bolt into peg using Allen wrench until it projects out 16 mm.
3) Adhere copper strips on floor.
4) Screw washers (D=60 mm) and (D=30 mm) with nuts onto hanger bolt, place plastic tubing firmly on hanger bolt and tighten by turning to the right.
5) Apply electrostatically dissipative floor coating.
6) After complete curing of the floor coating, pull off plastic tubing and clean contact surface of the nut.
7) Put connection eye in place and tighten with self-locking nut.
8) Squeeze grounding cable in the connection eye; this work is to be performed by a skilled electrician.

The electrostatic properties of the corresponding coating systems on various substrates were investigated. The results are reflected in the table below. Information on ambient conditions is also provided (absolute humidity).

TABLE

Electrostatic properties of the coating structure described according to FIG. 1

| Test surface designation | Resistance to ground | | System resistance | | Body voltage | |
|---|---|---|---|---|---|---|
| | Maximum measured value according to IEC 61340-4-1 (MΩ)[1] | Requirement according to IEC 61340-5-1 (MΩ) | Maximum measured value according to IEC 61340-4-5 (MΩ)[2] | Requirement according to IEC 61340-5-1 (MΩ) | Maximum measured value according to IEC 61340-4-5 (V)[3] | Requirement according to IEC 61340-5-1 (V) |
| Office LC | 7 | <1000 | n.d. | <1000 | n.d. | <100 |
| Office LC | 5 | | n.d. | | n.d. | |
| Office LC | n.d. | | 403 | | 8 | |
| Office LC | n.d. | | n.d. | | 12 | |
| Office LC | n.d. | | n.d. | | 14 | |
| Office LC | n.d. | | n.d. | | 4 | |
| Cellar | 30 | | n.d. | | n.d. | |
| Cellar | n.d. | | 457 | | n.d. | |
| Cellar | 105 | | n.d. | | n.d. | |
| Laboratory work top | n.d. | | 120 | | n.d. | |
| Laboratory work top | n.d. | | 280 | | n.d. | |
| Laboratory work top | n.d. | | 107 | | n.d. | |

| Test surface designation | Resistance to ground for protection of persons | | Remarks |
|---|---|---|---|
| | Minimum measured value according to VDE-0100-600[4] (kΩ) | Requirement according to VDE-0100-410 (kΩ) for voltages >500 V | |
| Office LC | 220 | >100 | Measured 7 days after application of the last layer |
| Office LC | 870 | | Measured 470 days after application of the last layer |
| Office LC | n.d. | | Measured with ESD shoes from manufacturer A 35 days after application of the last layer at relative humidity of 5.0 g/m³ |
| Office LC | n.d. | | Measured with ESD shoes from manufacturer A 202 days after application of the last layer at relative humidity of 6.6 g/m³ |
| Office LC | n.d. | | Measured with ESD shoes from manufacturer B 281 days after application of the last layer at relative humidity of 5.0 g/m³ |
| Office LC | n.d. | | Measured with ESD shoes from manufacturer B 370 days after application of the last layer at relative humidity of 4.8 g/m³ |
| Cellar | 680 | | Measured 12 days after application of the last layer |
| Cellar | n.d. | | Measured with ESD shoes from manufacturer A 88 days after application of the last layer at relative humidity of 5.1 g/m³ |
| Cellar | 3600 | | Measured 550 days after application of the final layer |
| Laboratory work top | n.d. | | Value determined in climate chamber at relative humidity of 2.5 g/m³; weight of ESD shoe 12.5 kg according to IEC 61340-4-3 |
| Laboratory work top | n.d. | | Value determined in climate chamber at relative humidity of 5.1 g/m³; weight of ESD shoe 12.5 kg according to IEC 61340-4-3 |
| Laboratory work top | n.d. | | Value determined in climate chamber at relative humidity of 10.3 g/m³; Weight of ESD shoe 12.5 kg according to IEC 61340-4-3 |

[1] Measurement voltage 100 V; electrode weight 2.5 kg
[2] Measurement voltage 100 V; hand electrode-person-ESD shoe according to IEC 61340-4-3 coating system
[3] Field Meter Set PFK-100 from PROSTAT and Analog-Digital Converter Agilent 34410 A with evaluation software
[4] Plate electrode with damp cloth; direct current 1000 V

The invention claimed is:

1. A coating system on a substrate for the protection against electrostatic discharge, comprising in the following order
    a) an undercoat on the substrate,
    b) a non-dissipative synthetic resin layer; and
    c) a dissipative synthetic resin layer having a resistance to ground according to VDE-0100-410 of at least 100 kohm,
    wherein a grounding device for grounding the coating system is arranged between the dissipative synthetic resin layer and the non-dissipative synthetic resin layer.

2. The coating system according to claim 1, wherein the coating system is a floor coating system.

3. The coating system according to claim 2, wherein the coating system has no conductive film.

4. The coating system according to claim 1, wherein the coating system has no conductive film.

5. The coating system according to claim 4, wherein a scratch coat for leveling is arranged between the undercoat and the non-dissipative synthetic resin layer.

6. The coating system according to claim 1, wherein a scratch coat for leveling is arranged between the undercoat and the non-dissipative synthetic resin layer.

7. The coating system according to claim 6, wherein the non-dissipative synthetic resin layer has a layer thickness in the range of 0.5 to 20 mm and/or wherein the dissipative synthetic resin layer has a layer thickness in the range of 20 to 5000 μm.

8. The coating system according to claim 1, wherein the non-dissipative synthetic resin layer has a layer thickness in the range of 0.5 to 20 mm and/or wherein the dissipative synthetic resin layer has a layer thickness in the range of 20 to 5000 μm.

9. The coating system according to claim 8, wherein the non-dissipative synthetic resin layer and/or the dissipative synthetic resin layer have very low TVOC emission.

10. The coating system according to claim 1, wherein the non-dissipative synthetic resin layer and/or the dissipative synthetic resin layer have very low TVOC emission.

11. The coating system according to claim 10, wherein the non-dissipative synthetic resin layer has a resistance to ground of more than $10^9$ ohm, determined according to IEC 61340-4-1, and/or wherein the dissipative synthetic resin layer has a resistance to ground of no more than $10^9$ ohm, determined according to IEC 61340-4-1.

12. The coating system according to claim 1, wherein the non-dissipative synthetic resin layer has a resistance to ground of more than $10^9$ ohm, determined according to IEC 61340-4-1, and/or wherein the dissipative synthetic resin layer has a resistance to ground of no more than $10^9$ ohm, determined according to IEC 61340-4-1.

13. The coating system according to claim 1, wherein the synthetic resin layers and the synthetic resin undercoat are made of cured reaction resins or reaction resin compounds, which optionally contain one or more additives, the reaction resins that are used for the respective layer or undercoat independently of one another being selected from epoxy resins, polyurethanes, polyureas, mixtures of polyurethanes and polyureas, polymethacrylates, polyacrylates, cementitious hybrid systems, and polymer-modified cementitious mixtures.

14. The coating system according to claim 1, wherein the non-dissipative synthetic resin layer contains one or more additives selected from solvents and water, coloring agents such as colored quartz, dyes, pigments and color chips; fillers, such as quartz sands, ceramic powders, sand, chalk, fibers, hollow spheres and glass beads, emulsifiers, thixotropic agents, and film-forming aids.

15. The coating system according to claim 1, wherein the dissipative synthetic resin layer contains one more conductive additives for setting the electrical properties, for example, carbon fibers, carbon black, graphite, silicon carbide, metal oxides, metals such as iron, ammonium salts, heavy metal-containing or metal-containing fillers, especially antimony- and tin-containing fillers based on titanium dioxide or mica, ionic liquids, ionic and nonionic surfactants, melamine sulfonates and polycarboxylate ethers.

16. The coating system according to claim 1, wherein the system resistance is less than $10^9$ ohm and/or the body voltage is less than 100 volt, measured according to IEC-61340-4-5.

17. A method for producing a coating system on a substrate for the protection against electrostatic discharge according to claim 1, comprising the following steps:
 a) Applying an undercoat composition to the substrate and curing to form an undercoat;
 b) optionally applying, and curing, a scratch coat to the undercoat for leveling
 c) applying a reaction resin composition to the undercoat or the scratch coat and curing to form a non-dissipative synthetic resin layer;
 d) installing a grounding device on the non-dissipative synthetic resin layer for grounding the coating system; and
 e) applying a reaction resin composition over the grounding device and the non-dissipative synthetic resin layer and curing to form the dissipative synthetic resin layer having a resistance to ground according to VDE-0100-410 of at least 100 kohm.

18. A method for converting an existing coating system, comprising
 a) an undercoat on the substrate, optionally a scratch coat for leveling, and b) a non-dissipative synthetic resin layer, for producing a coating system on a substrate for the protection against electrostatic discharge according to claim 1, comprising the following steps:
 a) installing a grounding device on the non-dissipative synthetic resin layer of the existing coating system to ground the coating system; and
 b) applying a reaction resin composition over the grounding device and the non-dissipative synthetic resin layer and curing to form the dissipative synthetic resin layer having a resistance to ground according to VDE-0100-410 of at least 100 kohm.

19. The method for renovating a coating system on a substrate for the protection against electrostatic discharge according to claim 1 in which the dissipative synthetic resin layer is partially worn away, comprising:
 a) applying a reaction resin composition over the dissipative synthetic resin layer and curing to form the dissipative synthetic resin layer having a resistance to ground according to VDE-0100-410 of at least 100 kohm.

20. The method according to either claim 18, wherein, before applying the new dissipative synthetic resin layer, the existing partially worn away dissipative synthetic resin layer, or before installation of the grounding device, the existing non-dissipative synthetic resin layer is subjected to a pretreatment, for example, grinding, sand-blasting, shot-blasting or stripping with solvents or acids.

* * * * *